United States Patent
Sawayama et al.

(10) Patent No.: US 7,638,352 B2
(45) Date of Patent: Dec. 29, 2009

(54) METHOD OF MANUFACTURING PHOTOELECTRIC CONVERSION DEVICE

(75) Inventors: Tadashi Sawayama, Machida (JP); Takeshi Kojima, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/033,081

(22) Filed: Feb. 19, 2008

(65) Prior Publication Data
US 2008/0206983 A1 Aug. 28, 2008

(30) Foreign Application Priority Data
Feb. 23, 2007 (JP) ............... 2007-044010

(51) Int. Cl.
*H01L 21/00* (2006.01)
(52) U.S. Cl. .............. 438/57; 438/45; 438/54; 257/E25.004; 257/E25.009; 257/E27.123
(58) Field of Classification Search .......... 438/48–57; 257/E25.004, E25.009, E27.123
See application file for complete search history.

(56) References Cited

U.S. PATENT DOCUMENTS

| | | | |
|---|---|---|---|
| 2003/0197228 A1 | 10/2003 | Okuda et al. | 257/369 |
| 2007/0045687 A1* | 3/2007 | Kumura et al. | 257/295 |
| 2008/0096291 A1 | 4/2008 | Takai et al. | 438/7 |

FOREIGN PATENT DOCUMENTS

| | | |
|---|---|---|
| JP | 2003-264277 | 9/2003 |
| JP | 2003-264281 | 9/2003 |
| JP | 2004-179329 | 6/2004 |
| JP | 2005-72541 | 3/2005 |
| JP | 2006-210685 | 8/2006 |

OTHER PUBLICATIONS

Notification of Reason for Refusal dated Oct. 30, 2007, regarding Application No. 2007-044010.

* cited by examiner

*Primary Examiner*—Alexander G Ghyka
*Assistant Examiner*—Abdulfattah Mustapha
(74) *Attorney, Agent, or Firm*—Fitzpatrick, Cella, Harper & Scinto

(57) ABSTRACT

The present invention is a method of manufacturing a photoelectric conversion device having a multilayered interconnection (wiring) structure disposed on a semiconductor substrate, including steps of forming a hole in a region of the interlayer insulation film corresponding to an electrode of the transistor; burying an electroconductive substance in the hole; forming a hydrogen supplying film; conducting a thermal processing at a first temperature to supply a hydrogen from the hydrogen supplying film to the semiconductor substrate; forming the multilayered interconnection structure using Cu in a wiring material; and forming a protective film covering the multilayered interconnection structure, wherein the step of forming the multilayered interconnection structure, and the step of forming the protective film are conducted at a temperature not higher than the first temperature.

1 Claim, 6 Drawing Sheets

METHOD OF MANUFACTURING PHOTOELECTRIC CONVERSION DEVICE

BACKGROUND OF THE INVENTION

1. Field of the Invention

The present invention relates to a method of manufacturing a photoelectric conversion device and relates, more particularly, to a method of manufacturing a photoelectric conversion device with Cu for wiring.

2. Description of the Related Art

Photoelectric conversion devices are frequently used as a sensor for digital cameras. In the recent years, as such a photoelectric conversion device, an MOS photoelectric conversion device with a plurality of MOS transistors pixel read-out circuit is used.

MOS photoelectric conversion devices respectively require wiring for driving MOS transistors and wiring for reading signals. Therefore, wiring increases in number in comparison with a CCD. Accordingly, multilayered wiring structure with a plurality of wiring layers being stacked through interlayer insulation film is adopted. For such wiring material, conventionally aluminum has been used frequently. In contrast, use of Cu as wiring material in order to decrease size of wiring pitch further and otherwise in order to make film thickness of wiring thinner to decrease height of a photoelectric conversion device is described in Japanese Patent Application Laid-Open No. 2003-264281.

In addition, in a photoelectric conversion device, defects in a semiconductor substrate occasionally served as a source of generating a dark current to cause deterioration in signals. In contrast, techniques of supplying the semiconductor substrate with hydrogen to terminate dangling bond of a substrate surface (hydrogen terminating techniques) are proposed. As one of the hydrogen terminating techniques, Japanese Patent Application Laid-Open No. 2003-264277 has disclosed forming a contact plug made of tungsten and thereafter heating in one of an atmosphere including nitrogen and hydrogen and a hydrogen atmosphere.

It is important to cause a photoelectric conversion device to undergo hydrogen termination in order to recover the crystal defect and the interface state of a semiconductor substrate. However, for supplying a semiconductor substrate with hydrogen, temperature thereof is important. Therefore, conducting thermal processing with one of a constant and higher temperature is required.

However, thermal processing after forming wiring occasionally may lead to increase in wiring resistance and stress migration of wiring material in the case of a high temperature of, for example, 400° C. or more. In particular, in the case of adopting Cu for wiring material, the above described increase in wiring resistance and stress migration of wiring material occasionally take place at a temperature lower than in the case of aluminum. Moreover, depending on temperature for thermal processing and time for processing, diffusion of Cu to the front side from the rear side of a semiconductor substrate occasionally gives rise to a problem. Attachment of a certain amount of Cu on the rear side of the semiconductor substrate during a film forming step is considered to be a reason thereof.

That is, in the case of using Cu as wiring material, hydrogen terminating processing in the case where the wiring material is aluminum, that has been frequently used to date, cannot be directly used. Terminating processing suitable for the case of using Cu as wiring material has not been considered sufficiently.

Moreover, in Japanese Patent Application Laid-Open No. 2003-264277, thermal processing is conducted by depositing tungsten in a contact aperture and thereafter removing tungsten outside the contact aperture. However, hydrogen for recovering the crystal defect and the interface state of a semiconductor substrate is not sufficiently supplied and consequently a sufficient dark current reducing effect is occasionally not obtainable. That is, conducting thermal processing alone in a hydrogen atmosphere will cause hydrogen to leave toward the upper part of a semiconductor substrate at the same time when hydrogen is supplied.

In view of the above described problem, an object of the present invention is to provide a method of manufacturing a photoelectric conversion device enabling suitable hydrogen terminating processing even in the case of using Cu for wiring material.

SUMMARY OF THE INVENTION

The present invention is a method of manufacturing a photoelectric conversion device having a photoelectric conversion element, a transistor for reading out a signal from the photoelectric conversion element and a multilayered interconnection structure disposed on a semiconductor substrate comprising steps of: forming an interlayer insulation film on the photoelectric conversion element and the transistor; forming a hole in a region of the interlayer insulation film corresponding to an electrode of the transistor; burying an electro-conductive substance in the hole; forming a hydrogen supplying film; conducting a thermal processing at a first temperature to supply a hydrogen from the hydrogen supplying film to the semiconductor substrate; forming the multilayered interconnection structure using Cu in a wiring material; and forming a protective film covering the multilayered interconnection structure, wherein the step of forming the multilayered interconnection structure, and the step of forming the protective film are conducted at a temperature not higher than the first temperature.

Other features and advantages of the present invention will be apparent from the following description taken in conjunction with the accompanying drawings, in which like reference characters designate the same or similar parts throughout the figures thereof.

Further features of the present invention will become apparent from the following description of exemplary embodiments with reference to the attached drawings.

The accompanying drawings, which are incorporated in and constitute a part of the specification, illustrate embodiments of the invention and, together with the description, serve to explain the principles of the invention.

DESCRIPTION OF THE EMBODIMENTS

Preferred embodiments of the present invention will now be described in detail in accordance with the accompanying drawings.

The present invention is attained based on finding that conducting thermal processing at a temperature not lower than a certain temperature at the occasion of conducting hydrogen termination is highly effective for reducing a dark current. However, the temperature appropriate for that hydrogen termination deteriorates property of wiring and therefore is not preferable in the case of using Cu for wiring material. Accordingly, the present invention is characterized in that the step of hydrogen terminating processing is conducted at the above described temperature not lower than a certain temperature prior to forming film of Cu to become wiring material after forming an electroconductive substance (plug) for establishing electrical connection of an electrode of a transistor to wiring. At that time, all steps after conducting hydrogen terminating processing is conducted at a temperature not hither than the temperature at which hydrogen terminating processing was conducted. Thereby, also a photoelectric conversion device using Cu for wiring material is capable of attaining reduction in dark current by suitable hydrogen termination.

Here, a temperature for conducting hydrogen terminating processing is desired to be not less than 400° C. In addition, the upper limit of the temperature at the time of hydrogen terminating processing is desired to be not higher than the temperature of thermal processing for forming silicide so that silicide is thermally influenced to decrease variation in contact resistance in the case of forming silicide in electrodes of a transistor, that is, source and drain. Specifically, 800° C. or lower is desirable.

Figure 1:
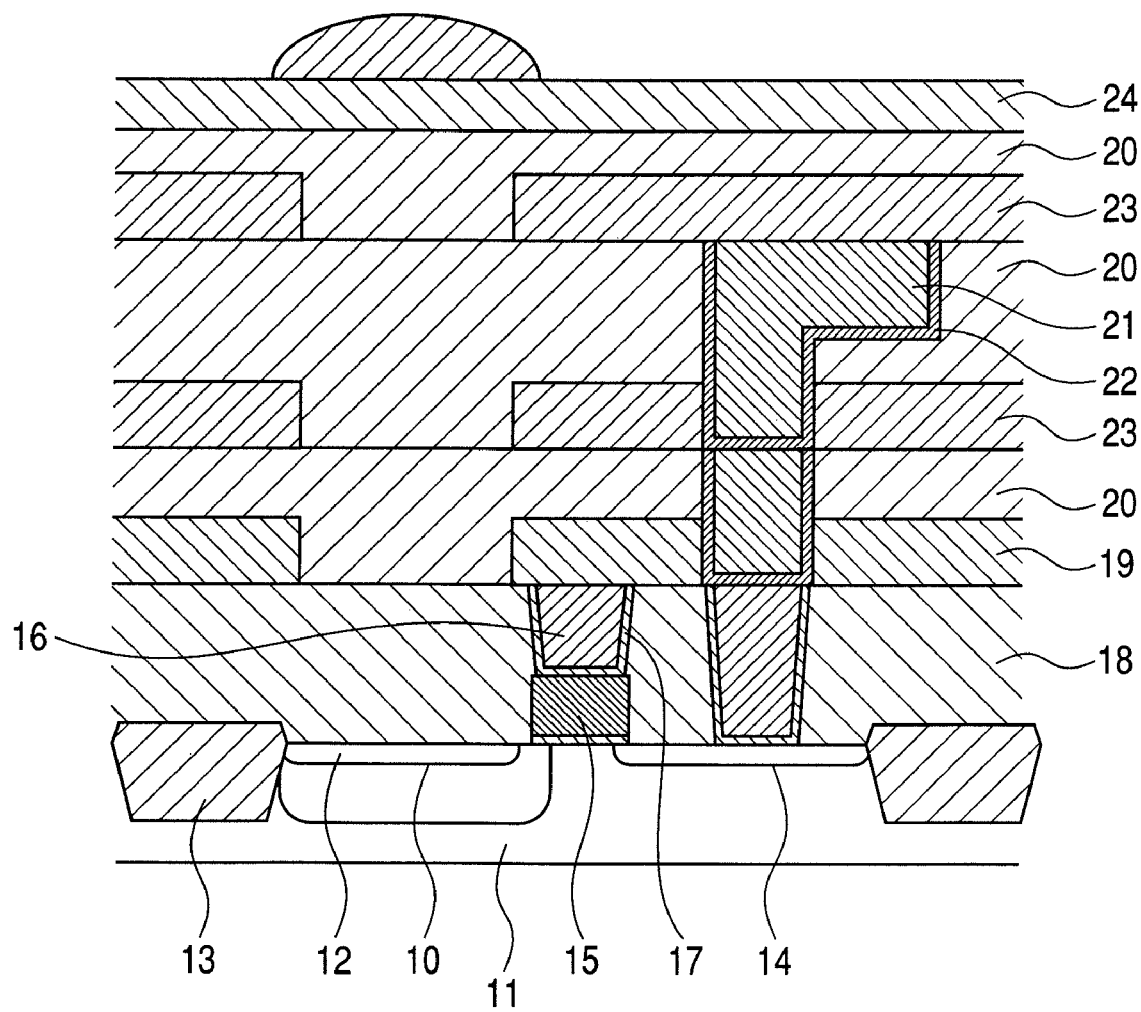
FIG. 1 is sectional structure of a photoelectric conversion device according to the present invention.

FIG. 1 exemplifies a sectional diagram of a photoelectric conversion device of the present invention. Here, a sectional diagram illustrates a portion including a photodiode to become a photoelectric conversion element and a transfer transistor transferring electrical charge in a photodiode. In the adaptation, multilayered interconnection (wiring) structure is adopted in a semiconductor substrate.

Reference numeral 10 denotes a semiconductor region of a first electrically conductive type adapted to a part of the photoelectric conversion element. Reference numeral 11 denotes a semiconductor region of a second electrically conductive type adapted to PN junction with the semiconductor region 10. The semiconductor regions 10 and 11 are adapted to the photodiode. The semiconductor region 10 is a region where signal charge is accumulated and is an electrically conductive type with the same polarity as the polarity of the signal charge. An N type is adopted in the case where the signal charge is an electron and a P type is adopted in the case of a hole. Moreover, a semiconductor region 12 of a second electrically conductive type can be disposed on the surface of the semiconductor region 10 to decrease influence of defects of the surface.

Reference numeral 13 denotes an element separating region for electrically separating adjacent elements. Reference numeral 14 denotes a semiconductor region of a first electrically conductive type. The semiconductor region 14 is a region where signal charges accumulated in the semiconductor region 10 are transferred and functions as an input part of an amplifier element to be described later. After the electric charges are transferred, the signals are read out in the state where potential of the semiconductor region 14 is in a floating state, which, therefore, can also be called floating diffusion.

Reference numeral 15 denotes a transfer gate for transferring the signal charge from the semiconductor region 10 to the semiconductor region 14. The semiconductor regions 10 and 14 and the transfer gate 15 are adapted to an MOS transistor for transfer. Reference numeral 16 denotes an electrically conductive plug for conducting electrical connection of a semiconductor region disposed in a semiconductor substrate to a wiring layer of an upper layer and conducting electrical connection of a gate electrode of an MOS transistor to a wiring layer of an upper layer. Reference numeral 17 denotes a metal diffusion suppressing film (barrier metal). TiN, for example, can be adapted thereto.

Reference numeral 18 denotes first interlayer insulation film. The film is arranged over the above described photoelectric conversion element and over the transistor. As an example, BPSG and P—$SiO_2$ (silicon oxide film formed by a plasma CVD method) can be used.

Reference numeral 19 denotes hydrogen supplying film. As an example, a silicon nitride film containing a large amount of hydrogen can be used. For example, hydrogen concentration inside film is not less than $1 \times 10^{21}$ $cm^{-3}$. The silicon nitride film 7 thus containing a lot of amount of hydrogen is formed, for example, by a single wafer CVD (chemical vapor phase growing) apparatus. At that occasion, by forming film by a plasma CVD method, film with desired hydrogen concentration will become easily obtainable.

Reference numeral 20 denotes second interlayer insulation film. P—$SiO_2$ can be used. Reference numeral 21 denotes a wiring layer. Cu is used as wiring material. Reference numeral 22 denotes metal diffusion suppressing film. As an example, TaN and TiN can be used.

Reference numeral 23 denotes metal diffusion suppressing film. In addition, the film can also be used as etching stop film in an etching step adopted at the occasion of forming a groove for burying wiring. As an example, SiN film, SiC film and the like can be used. Film for common use as diffusion suppressing film and etching stop film will be taken as the diffusion suppressing film. A layer 23 provided in the top layer functions mainly as diffusion suppressing film.

Reference numeral 24 denotes a protective layer. For example, SiN film can be used. Moreover, a color filter and a micro lens can be provided over the protective layer as required. The color filter and the micro lens are disposed covering the multilayered interconnection structure.

Figure 10:
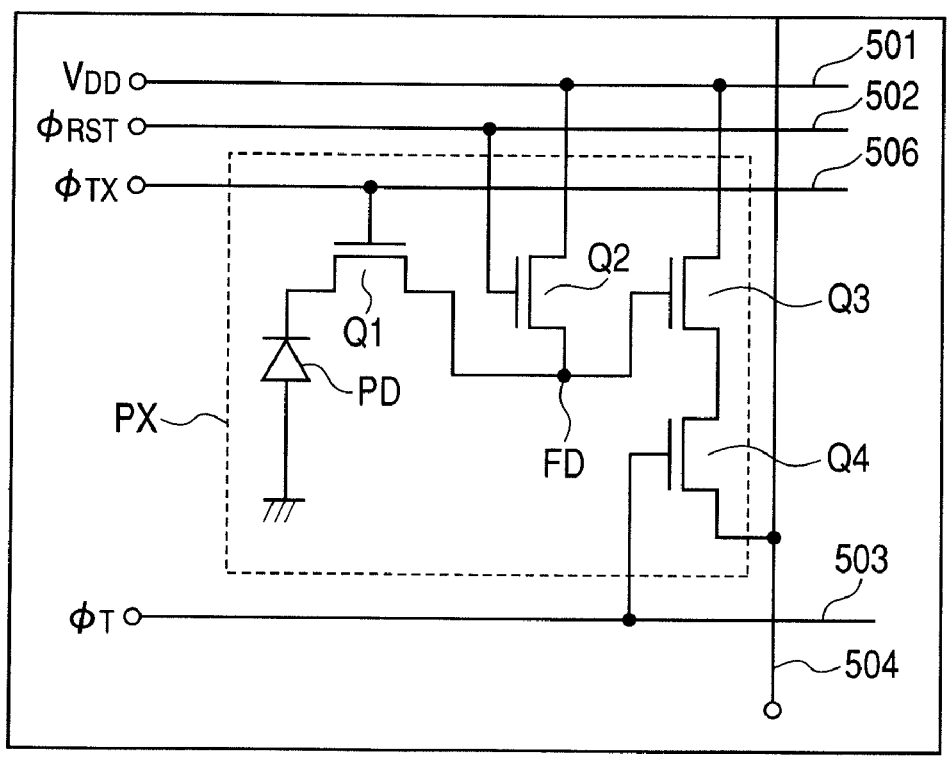
FIG. 10 is an equivalent circuit diagram of one pixel of a photoelectric conversion device.

Next, FIG. 10 is an equivalent circuit diagram illustrating one pixel of a photoelectric conversion device.

Reference characters PD denote a photodiode functioning as a photoelectric conversion element. Reference character with numeral Q1 denotes a transfer MOS transistor for transferring electrical charge of the photodiode PD. Reference characters FD denote a semiconductor region (floating diffusion) functioning as an input part of an amplifier element. The semiconductor region FD is equivalent to the semiconductor region 14 in FIG. 1. Reference character with numeral Q2 denotes a reset MOS transistor for resetting potential of the semiconductor region FD. Reference character with numeral Q3 denotes an amplifier MOS transistor adapted to a part of an amplifier circuit for amplifying signals based on charge of the semiconductor region FD. The amplifier MOS transistor Q3 is adapted to a part of a source follower circuit to become an amplifier circuit together with a constant current source not illustrated in the drawing. Reference character with numeral Q4 denotes a selective MOS transistor for selecting and reading out signals of a particular pixel. Reference numeral 501 denotes a power supply line for supplying drains of the transistors Q2 and Q3 with power supply voltages. Reference numeral 502 denotes a reset gate line for driving the transistor Q2 and reference numeral 503 denotes a selective gate line for driving the transistor Q4. Reference numeral 504 denotes a vertical signal line with which signals of each pixel are read out. Reference numeral 506 denotes a transfer gate line for driving the transistor Q1. In addition, another example can be adapted, as a system of selecting pixels, to select pixels by controlling potential of the semiconductor region FD with the transistor Q2 without providing the transistor Q4. In addition, a plurality of pixels can be commonly provided to particular elements such as the transistors Q2 and Q3. Such pixels are adapted to the photoelectric conversion device by being aligned and otherwise arrayed one-dimensionally and otherwise two dimensionally.

Next, manufacturing steps of the photoelectric conversion device illustrated in FIG. 1 will be described. In the respective diagrams, like reference characters designate the same or similar parts throughout the figures thereof.

Figure 2:
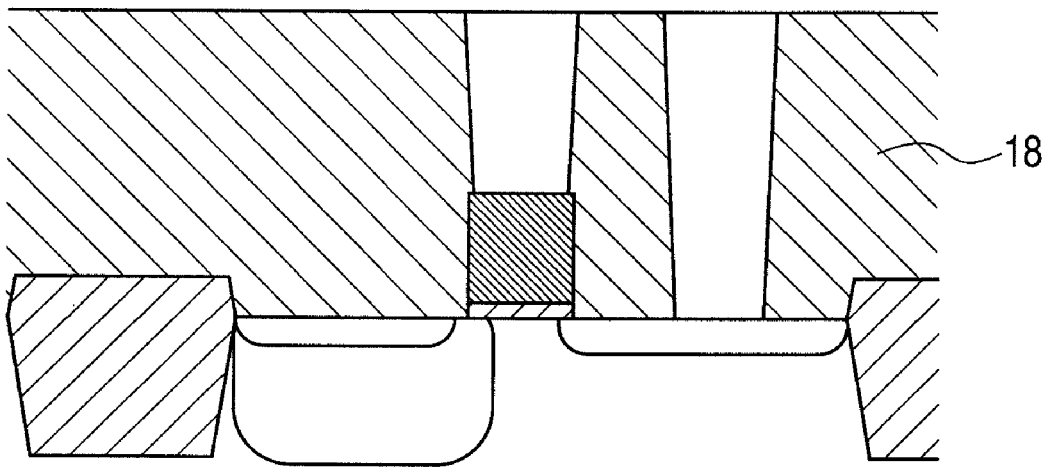
FIG. 2 is a diagram illustrating a step of manufacturing process of a photoelectric conversion device according to the present invention.

At first, by a normal method as illustrated in FIG. 2, the photoelectric conversion element, the semiconductor region and the element separation region are formed in the semiconductor substrate. After insulation film such as silicon oxide film is formed, the above described respective transistor gate electrodes are formed. Thereby, the interlayer insulation film 18 is formed.

Thereafter, a contact hole is formed in the interlayer insulation film 18 corresponding to a region requiring electrical connection to wiring of the upper layer. After the contact hole is formed, impurity implantation is conducted for reducing electrical resistance between the electroconductive substance to be buried in the contact hole and the semiconductor region. After conducting impurity implantation, thermal processing is conducted at 600 to 1000° C. and preferably at around 800° C. to diffuse the implanted impurity. That arrangement will not be limited to impurity intensifying impurity concentration of semiconductor but can be applied to silicide after implanting cobalt.

Figure 3:
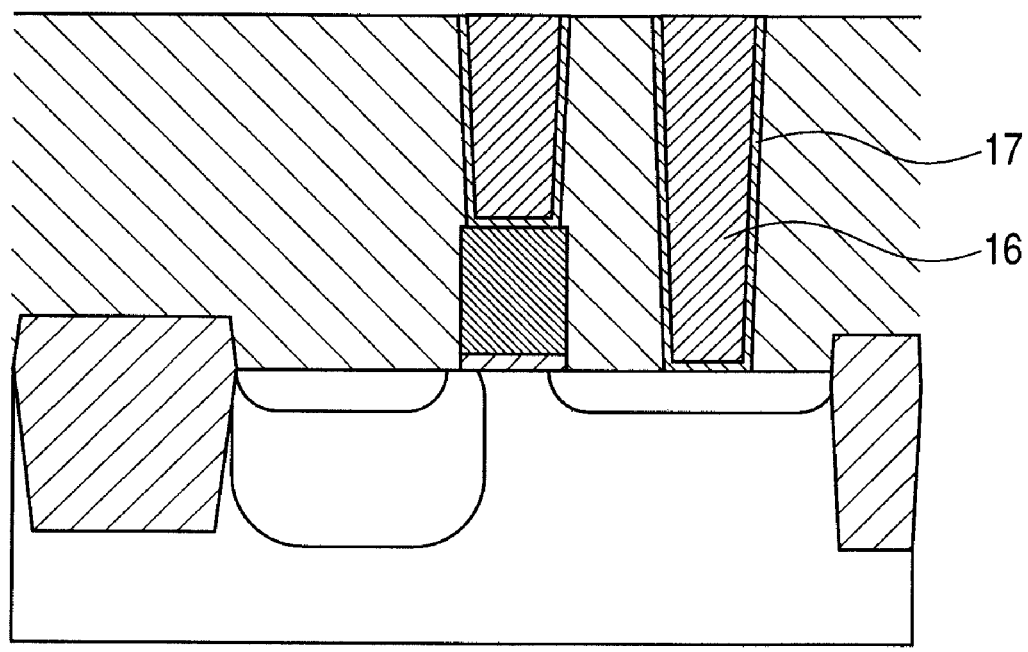
FIG. 3 is a diagram illustrating a step of manufacturing process of a photoelectric conversion device according to the present invention.

Next, as illustrated in FIG. 3, electroconductive substance to become the metal diffusion suppressing film 17 and the plug 16 is formed and the electroconductive substance is buried in the contact hole. Thereafter, by a CMP step, the electroconductive substance other than the plug part is removed to bring a contact plug into planarizing. As the electroconductive substance, W and the like can be used.

Figure 4:
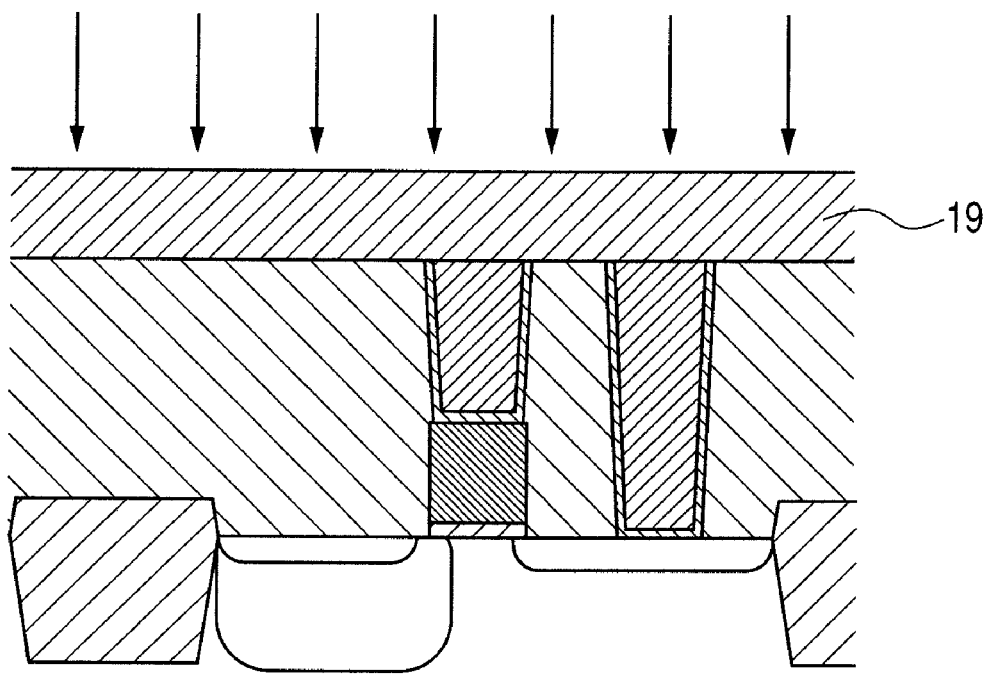
FIG. 4 is a diagram illustrating a step of manufacturing process of a photoelectric conversion device according to the present invention.

Thereafter, as illustrated in FIG. 4, the hydrogen supplying film 19 is formed. Silicon nitride film and the like containing a large quantity of hydrogen can be used as the hydrogen supplying film. In addition, by forming film by the plasma CVD method, film with desired hydrogen concentration will become easily obtainable. In addition, hydrogen concentration inside film at that time can be not less than $1 \times 10^{21}$ cm$^{-3}$.

Thereafter, thermal processing is conducted under a temperature condition of 400° C.$\leq$T$\leq$800° C. (first temperature). Hydrogen contained in the hydrogen supplying film 19 is diffused in the semiconductor substrate by thermal processing in an atmosphere, for example, nitrogen and hydrogen atmosphere, to conduct dangling bond termination to enable decrease in defects. Thereby, the dark current in the photoelectric conversion device can be decreased.

Figure 5:
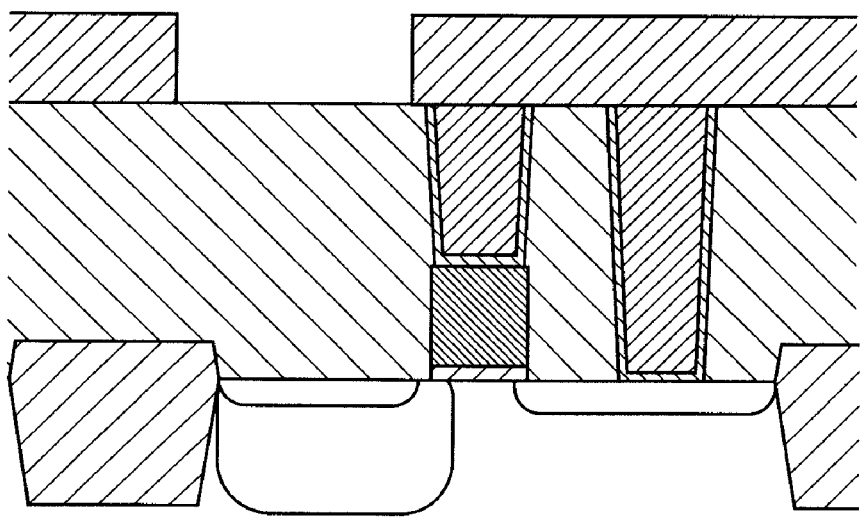
FIG. 5 is a diagram illustrating a step of manufacturing process of a photoelectric conversion device according to the present invention.

Next, as illustrated in FIG. 5, the hydrogen supplying film disposed in the region corresponding to the photodiode is removed by etching. A reason thereof is that the refractive indexes of the hydrogen supplying film and the interlayer insulation film disposed above and below the hydrogen supplying film are significantly different and, thereby, the incident light is reflected in the interface between the hydrogen supplying film and the interlayer insulation film and, therefore, sensitivity as a photoelectric conversion device decreases. However, in the case where difference in the refractive indexes between the hydrogen supplying film and the interlayer insulation film is not so significant, the hydrogen supplying film can be left as is over the light-receiving part.

Figure 6:
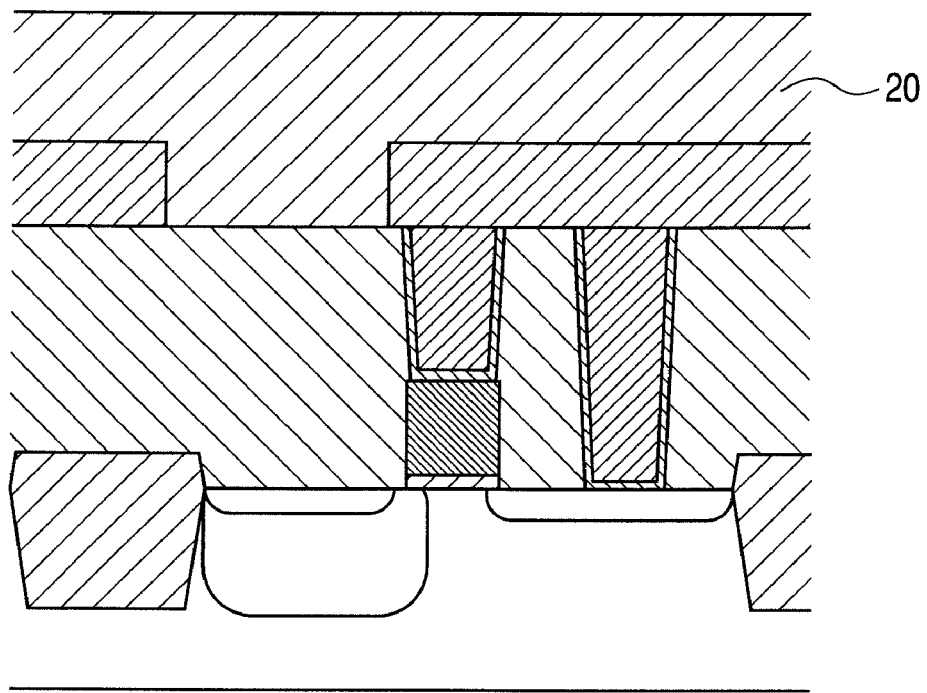
FIG. 6 is a diagram illustrating a step of manufacturing process of a photoelectric conversion device according to the present invention.

Next, as illustrated in FIG. 6, the interlayer insulation film 20 is formed so as to bury the region where the hydrogen supplying film is removed. As the interlayer insulation film, silicon oxide film can be formed by the plasma CVD method.

Figure 7:
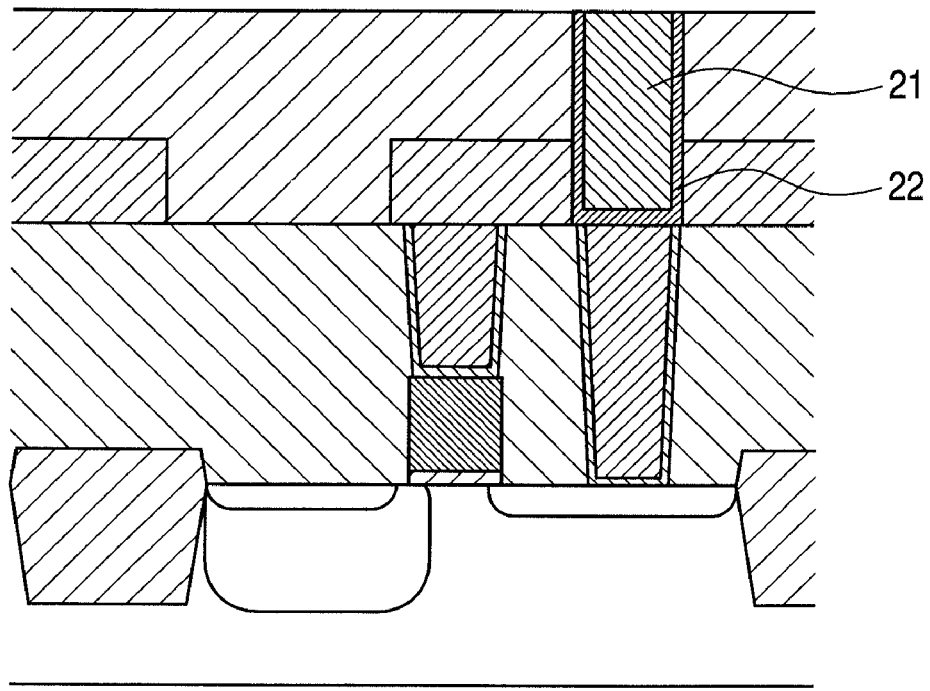
FIG. 7 is a diagram illustrating a step of manufacturing process of a photoelectric conversion device according to the present invention.

Next, as illustrated in FIG. 7, a wiring groove is formed in the hydrogen supplying film 19 and the interlayer insulation film 20. And after forming the diffusion suppressing film 22 for restraining diffusion of Cu with Ta, TaN and the like, Cu is buried in the grooves to form wiring. Cu is removed besides the wiring part by the CMP step to conduct planarization.

Figure 8:
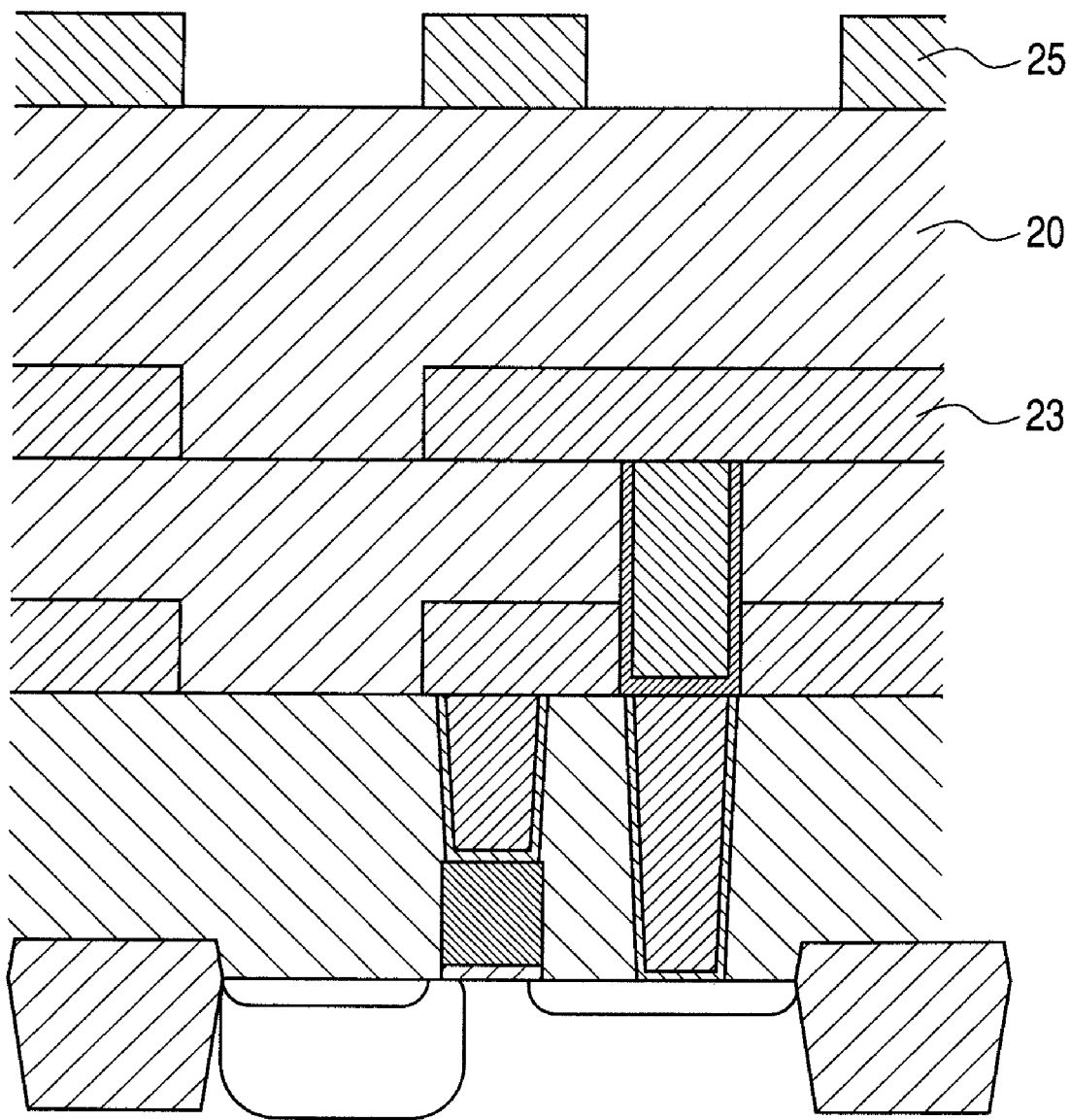
FIG. 8 is a diagram illustrating a step of manufacturing process of a photoelectric conversion device according to the present invention.

Next, as illustrated in FIG. 8, the diffusion suppressing film 23 is formed. The diffusion suppressing film can function as etching stop film. Specifically, silicon nitride film and the like are formed by the plasma CVD method. Here, the etching stop film had better be faster than the hydrogen supplying film 19 in etching speed. Here, the etching speed is a speed under the condition at the occasion of etching the interlayer insulation film. As a result of consideration by the inventors, it has become apparent that the hydrogen supplying film contains a large quantity of hydrogen to make the film quality apt to get hardened and the conditions for etching become severe when that hydrogen supplying film 19 and the diffusion suppressing film (etching stop film) 23 are formed under similar processing conditions. Accordingly, etching will be required to be conducted with large energy and for long time and, therefore, highly accurate control becomes difficult. Accordingly, the etching stop film (diffusion suppressing film) had better be faster than the hydrogen supplying film in etching speed.

Next, the diffusion suppressing film 23 disposed in the region corresponding to the photodiode is removed by etching. And the interlayer insulation film 20 is formed so as to bury the region where the diffusion suppressing film 23 is removed. Moreover, hard mask film 25 is formed in the upper layer thereof and the hard mask film 25 of the upper layer undergoes etching to give width of the wiring groove formed in the interlayer insulation film 20. SiN film, for example, can be used for the hard mask film 25.

Figure 9:
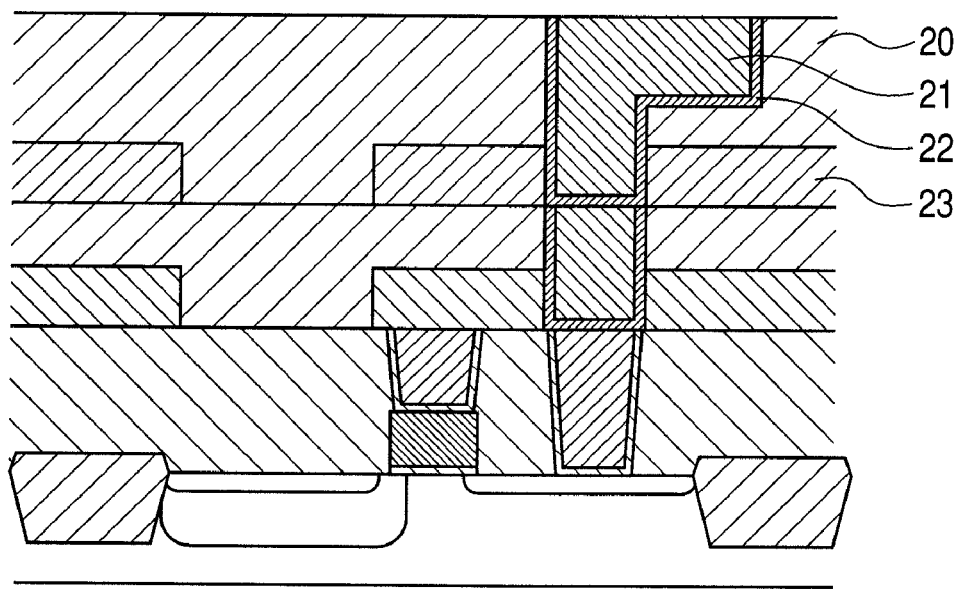
FIG. 9 is a diagram illustrating a step of manufacturing process of a photoelectric conversion device according to the present invention.

Next, resist is applied and exposed. Thereafter the interlayer insulation film 20 undergoes etching and is removed. Thereby, a via-hole is formed at first. Moreover, after removing the resist, a wiring groove is formed in the interlayer insulation film 20 with the hard mask film 25 as a hard mask. And, the diffusion suppressing film for restraining diffusion of Cu is formed with Ta, TaN and the like. Thereafter, Cu is buried. And, by the CMP step, Cu other than that used for wiring and the diffusion suppressing film are removed to conduct planarization. At that occasion, the hard mask layer 25 is concurrently removed as well (see FIG. 9).

Those wiring steps are conducted at a temperature not higher than the temperature at the occasion of forming the hydrogen supplying film and conducting hydrogen supply. Moreover, time for thermal processing can preferably be shortened.

Next, as illustrated in FIG. 1, the diffusion suppressing film 23 is formed and the diffusion suppressing film disposed in the region corresponding to the photodiode is removed by etching. And the interlayer insulation film 20 is formed so as to bury the region where the diffusion suppressing film 23 is removed.

Thereafter, the protective layer 24 is formed. The temperature at the occasion is not higher than the temperature for forming the hydrogen supplying film and the temperature for supplying hydrogen. That is, film forming is conducted at a temperature not higher than the temperature of film forming conditions of the hydrogen supplying film and for shorter time. Thereby, the already formed wiring will be supplied with no excessive thermal history. However, hydrogen supply is already conducted prior to the wiring step. Therefore, a certain quantity of dangling bond has been terminated.

Moreover, resist is applied and exposed over the protective layer 24. Then, a lens can be formed by etching the region corresponding to the photodiode with resist being left. Thereby, it is possible to introduce incident light coming from upwards efficiently to the photodiode.

Thus, in the present invention, wiring is formed after the plug for electrically connecting the semiconductor region formed in the semiconductor substrate to the wiring layer and after the hydrogen supplying film is formed before the wiring is formed and after thermal processing is conducted. Thereby, it is possible to conduct hydrogen supply without supplying to wiring the thermal history for long time and at high temperature which has been conventionally required in the hydrogen supplying step. Accordingly, it is possible to establish both use of material such as Cu with a low resistivity for wiring and restraint of defects in a semiconductor substrate.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-044010 filed Feb. 23, 2007, which is hereby incorporated by reference herein in its entirety.

What is claimed is:

1. A method of manufacturing a photoelectric conversion device having a photoelectric conversion element, a transistor for reading out a signal from the photoelectric conversion element, and a multilayered interconnection structure disposed on a semiconductor substrate, the method comprising steps of:
    forming an interlayer insulation film of the multilayered interconnection structure on the photoelectric conversion element and the transistor;
    forming a hole in a region of the interlayer insulation film corresponding to an electrode of the transistor;
    burying an electroconductive substance in the hole;
    forming a hydrogen supplying film, which has a refractive index different from that of the interlayer insulation film, over an entirety of the interlayer insulation film and the electrocondutive substance;
    conducting a thermal processing at a first temperature to supply hydrogen from the hydrogen supplying film to the semiconductor substrate;
    removing by etching a region of the hydrogen supplying film corresponding to the photoelectric conversion element;
    after the conducting of the thermal processing to supply the hydrogen, forming a wiring of the multilayered interconnection structure using Cu as a wiring material;
    forming a diffusion suppressing film, which has a refractive index different from that of the interlayer insulation film, for suppressing a diffusion of the Cu in the wiring material of the wiring of the multilayered interconnection structure, the diffusion suppressing film being formed above an entirety of the wiring and the interlayer insulation film of the multilayered interconnection structure;
    removing by etching a region of the diffusion suppressing film corresponding to the photoelectric conversion element; and
    forming a protective film covering the multilayered interconnection structure,
    wherein the steps of the method are conducted in an order as presented above, and the step of forming the wiring of the multilayered interconnection structure and the step of forming the protective film are conducted at a temperature not higher than the first temperature, so as not to cause an electromigration of the Cu of the wiring material of the wiring, and
    wherein the diffusion suppressing film operates also as an etching stop film in an etching of the interlayer insulation film, and the diffusion suppressing film has a larger etch rate in an etching of the interlayer insulation film than an etch rate of the hydrogen supplying film.

* * * * *